United States Patent [19]
Otoma et al.

[11] Patent Number: 5,563,901
[45] Date of Patent: Oct. 8, 1996

[54] SEMICONDUCTOR LASER ARRAY

[75] Inventors: Hiromi Otoma; Nobuaki Ueki; Hideki Fukunaga; Hideo Nakayama, all of Kanagawa, Japan

[73] Assignee: Fuji Xerox Co., Ltd., Tokyo, Japan

[21] Appl. No.: 420,822

[22] Filed: Apr. 12, 1995

[30] Foreign Application Priority Data

May 25, 1994 [JP] Japan ................................. 6-111056

[51] Int. Cl.$^6$ ..................................... H01S 3/19
[52] U.S. Cl. ............................. 372/50; 372/99; 372/108
[58] Field of Search ............................... 372/50, 108, 99

[56] References Cited

U.S. PATENT DOCUMENTS

| | | | |
|---|---|---|---|
| 4,718,070 | 1/1988 | Liau et al. | 372/44 |
| 4,784,722 | 11/1988 | Liau et al. | 156/649 |
| 4,935,939 | 6/1990 | Liau et al. | 372/98 |
| 4,990,465 | 2/1991 | Liau et al. | 437/129 |
| 5,253,263 | 10/1993 | Jansen et al. | 372/50 |
| 5,365,533 | 11/1994 | Groussin | 372/36 |
| 5,479,426 | 12/1995 | Nakanishi et al. | 372/50 |

FOREIGN PATENT DOCUMENTS 61-290788  12/1986  Japan .

OTHER PUBLICATIONS

A. J. SpringThorpe, "A novel double–heterostructure p–n–junction laser," Applied Physics Letter, vol. 31, No. 8, Oct. 15, 1977, pp. 524–525.

Z. L. Liau and J. N. Walpole, "Surface-emitting GaInAsp/Inp laser with low threshold current and high," Applied Physics Letters, vol. 46, No. 2, Jan. 15, 1985, pp. 115–117.

Primary Examiner—James W. Davie
Attorney, Agent, or Firm—Finnegan, Henderson, Farabow, Garrett & Dunner, L.L.P.

[57] ABSTRACT

In a semiconductor laser array in which a semiconductor laser element having a horizontal-direction cavity, and plural outer inclined reflecting mirrors capable of reflecting laser light projected from the semiconductor laser element along a specific direction are integrated on a semiconductor substrate in a monolithic form, these outer inclined reflecting mirrors are positioned adjacent to each other, and also are arranged in such a manner that a distance between the adjoining horizontal-direction cavities becomes longer while being located apart from said outer inclined reflecting mirrors.

14 Claims, 10 Drawing Sheets

SEMICONDUCTOR LASER ARRAY

BACKGROUND OF THE INVENTION

The present invention relates to a surface emitting type laser array having an "outer" inclined reflecting mirror and employed as a light source for an optical communication, an optical measurement, optical computing, or as a light source for writing information and a latent image into an optical disk and a photosensitive material.

Since the surface emitting type laser element may derive the laser light perpendicular to the semiconductor substrate surface, this laser element can be easily manufactured as a two-dimensional array. The two-dimensional surface emitting type laser array is a very useful element for constituting such systems of parallel optical transmission, coupling between electron integrated circuits, parallel information processing, image processing, and the like.

There are three present-day surface emitting type semiconductor laser elements under development: That is, (1). the vertical-direction cavity type surface emitting semiconductor laser element;

(2). the surface emitting type semiconductor laser element with combination of the horizontal-direction cavity and the 45-degree inclined reflecting mirror; and (3). the surface emitting type semiconductor laser element with combination of the horizontal-direction cavity and the distributed brag reflector (DBR).

Among these recently developed surface emitting type semiconductor laser elements, such a surface emitting type semiconductor laser element that both of the semiconductor laser element having the horizontal-direction cavity, and the 45-degree outer inclined reflecting mirror are manufactured on the semiconductor substrate in the monolithic integrated form, is known from the following publications: i.e., Japanese Laid-open Patent Application No. 61-290788 (opened in 1986); Applied Physics Letters, Volume 31, No. 8 (1977), pages 524; Applied Physics Letters, Volume 46, No. 2 (1985), pages 115 to 117; U.S. Pat. Nos. 4,718,070; 4,990465; 4,784,722; and 4,935,939.

Figure 10:
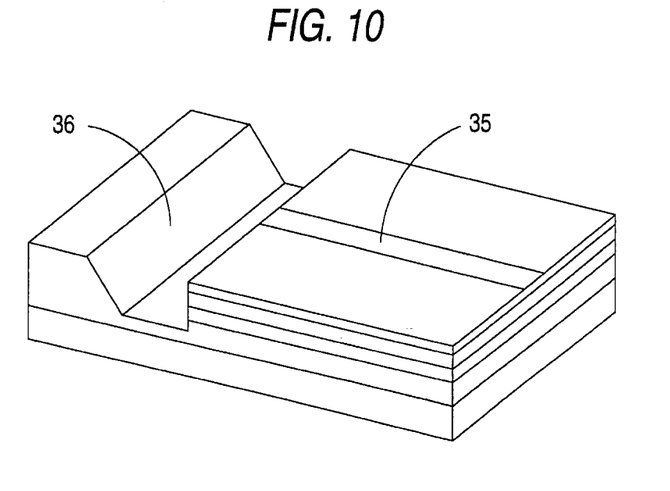
FIG. 10 is a perspective view for showing the conventional surface emitting type single beam semiconductor laser element in which the horizontal cavity and the 45-degree inclined reflecting mirror are formed on the same substrate in the monolithic form.

FIG. 10 is a perspective view for schematically indicating the surface emitting type laser element as described in the above-mentioned Japanese Laid-open Pat. Application No. 61-290788. In this surface emitting type laser element, the semiconductor laser element 35 having the horizontal-direction cavity and the 45-degree outer inclined reflecting mirror 36 are manufactured on the semiconductor substrate in the monolithic form.

Since the surface emitting type semiconductor laser element owns such a feature of high optical output power, as compared with the above-described item (1), i.e., the vertical-direction cavity type surface emitting semiconductor laser element (refer to, e.g., Electronic Communication Institute Technical Research Report OQE 84-9, in 1984), this surface emitting type semiconductor laser element may be utilized not only as a light source for a long distance optical communication, but also as a light source used to write information into an optical disk, and furthermore as a light source for writing a latent image into a photosensitive drum and the like.

Figure 11:
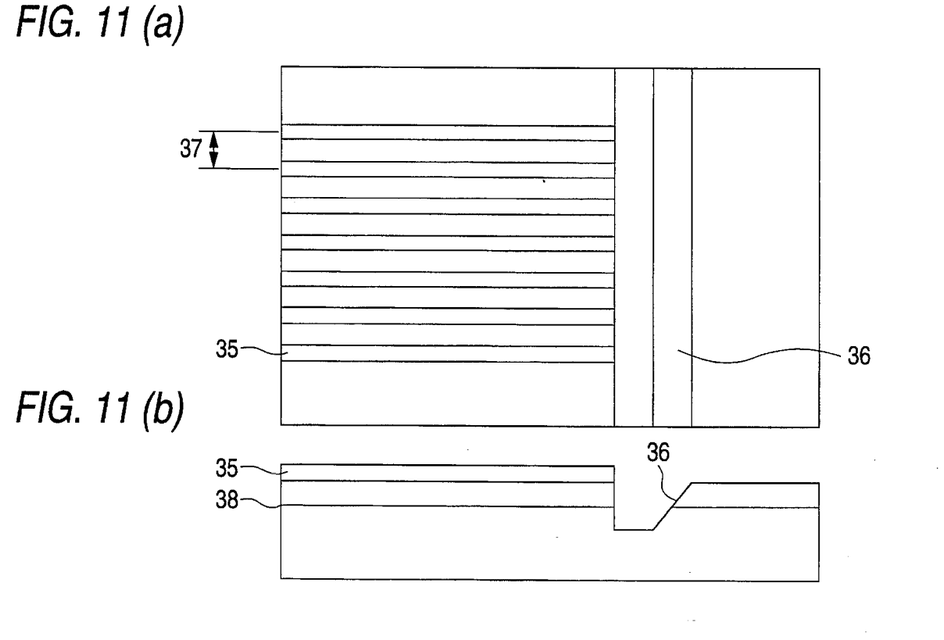
FIGS. 11(a) and 11(b) are plan/sectional views for indicating a surface emitting type multi-beam semiconductor laser array having a 45-degree inclined reflecting mirror.

In the case that this surface emitting type semiconductor laser element is utilized as a light source for writing a latent image into either an optical disk, or a photosensitive drum and the like, this semiconductor laser element has been used as a multi-beam semiconductor laser element in order to increase writing density, or reducing writing time. That is, as illustrated in FIGS. 11(a) and 11(b), a plurality of stripe electrodes 35 are formed in a parallel manner with each other on the common substrate, the surface emitting type semiconductor laser elements are arranged in an array form on in the semiconductor substrate surface, and also the intervals 37 between the adjoining semiconductor laser elements are made narrow, i.e., several tens of microns.

Such a surface emitting type semiconductor laser element, in which the stripe electrodes 35 are integrated along the same direction in the surface emitting type semiconductor laser element, and also the intervals 37 between the adjoining stripe electrodes are made narrow, i.e., several tens of microns, has several problems.

That is, a first of these problems is crosstalk. Namely, an electric crosstalk problem is produced such that a portion of current injected into a certain semiconductor laser element, is injected into the adjoining semiconductor laser elements, so that optical output power of the adjoining semiconductor laser elements is accidentally increased. Further, a thermal crosstalk problem is produced such that the heat produced while a certain semiconductor laser element is oscillated is transferred to the adjoining semiconductor laser elements, whereby the optical output power of the adjoining semiconductor laser elements is accidentally decreased. These crosstalk problems must be suppressed as much as possible in order to independently drive the multi-beam semiconductor laser element.

A second problem is a manufacturing problem occurring when a large number of bonding pads are fabricated on the multi-beam semiconductor laser element. In a semiconductor laser element, bonding pads electrically connected to stripe electrodes must be formed on a surface of the semiconductor laser element so as to conduct lead wires from the stripe electrodes. As this bonding pad, an area defined by 100×100 micrometers, for examples is required. In the normal single beam semiconductor laser element, as indicated in FIGS. 12 (a) and 12(b), since only one stripe electrode 40 is formed in the semiconductor laser element 38, there is no problem in forming a bonding pad 39 having an area on the order of 100×100 micrometers on the insulating film 41 of the semiconductor laser element 38.

Figure 12:
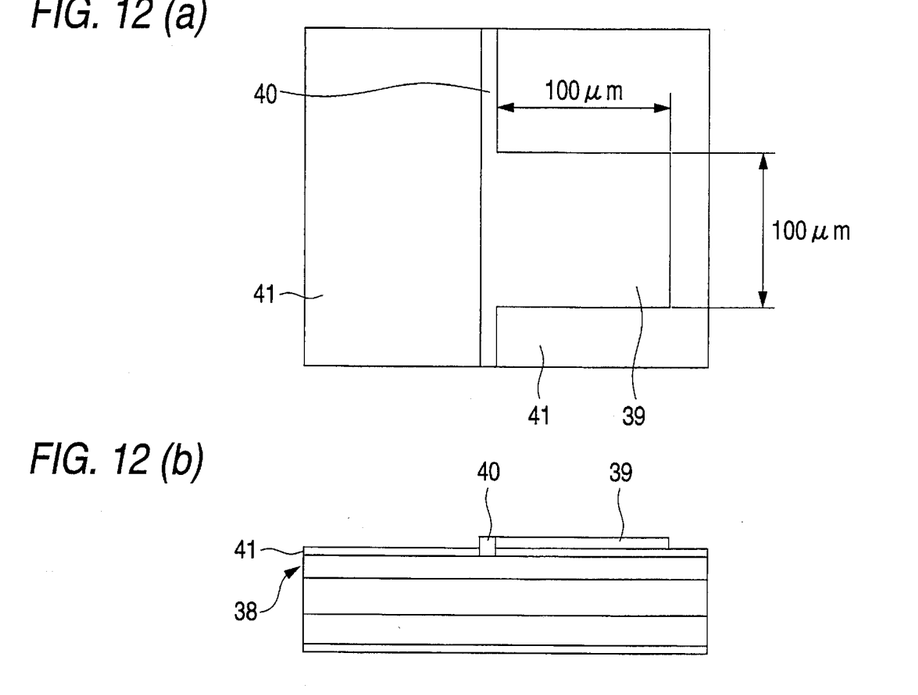
FIGS. 12(a) and 12(b) are plan/sectional views for representing a stripe electrode and a bonding pad in a single beam semiconductor laser element.

However, when a large number of stripe electrodes positioned in parallel are arranged adjacent to each other in narrow intervals, such as several tens of microns with respect to the multi-beam semiconductor laser element, there is a problem in that the bonding pad 39 having the dimension of 100×100 micrometers could not be directly connected to the respective stripe electrode 40, as represented in FIG. 12.

Figure 13:
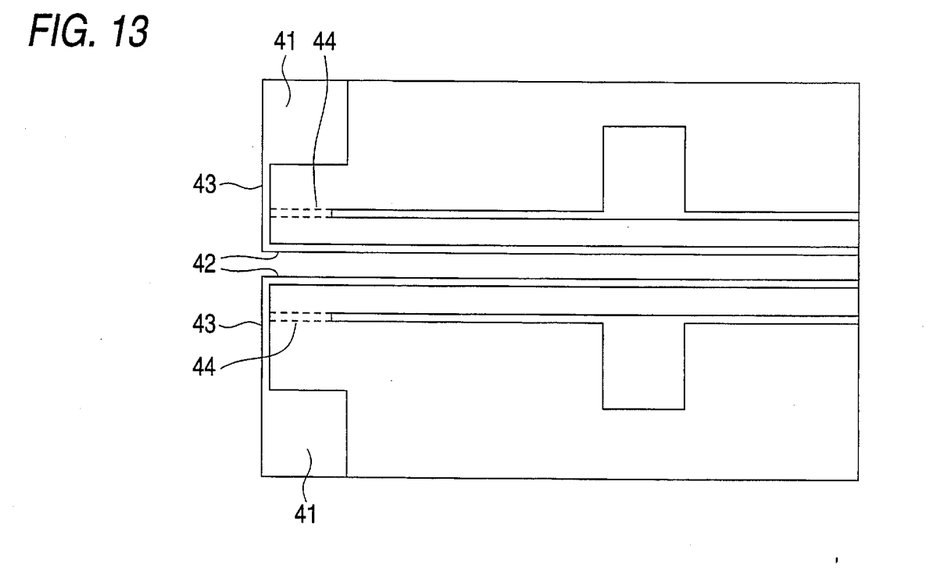
FIG. 13 is an explanatory diagram for indicating the wire connecting structure of the stripe electrode and the bonding pad of the conventional multi-beam semiconductor laser element by way of the drawing wiring line.
Figure 14:
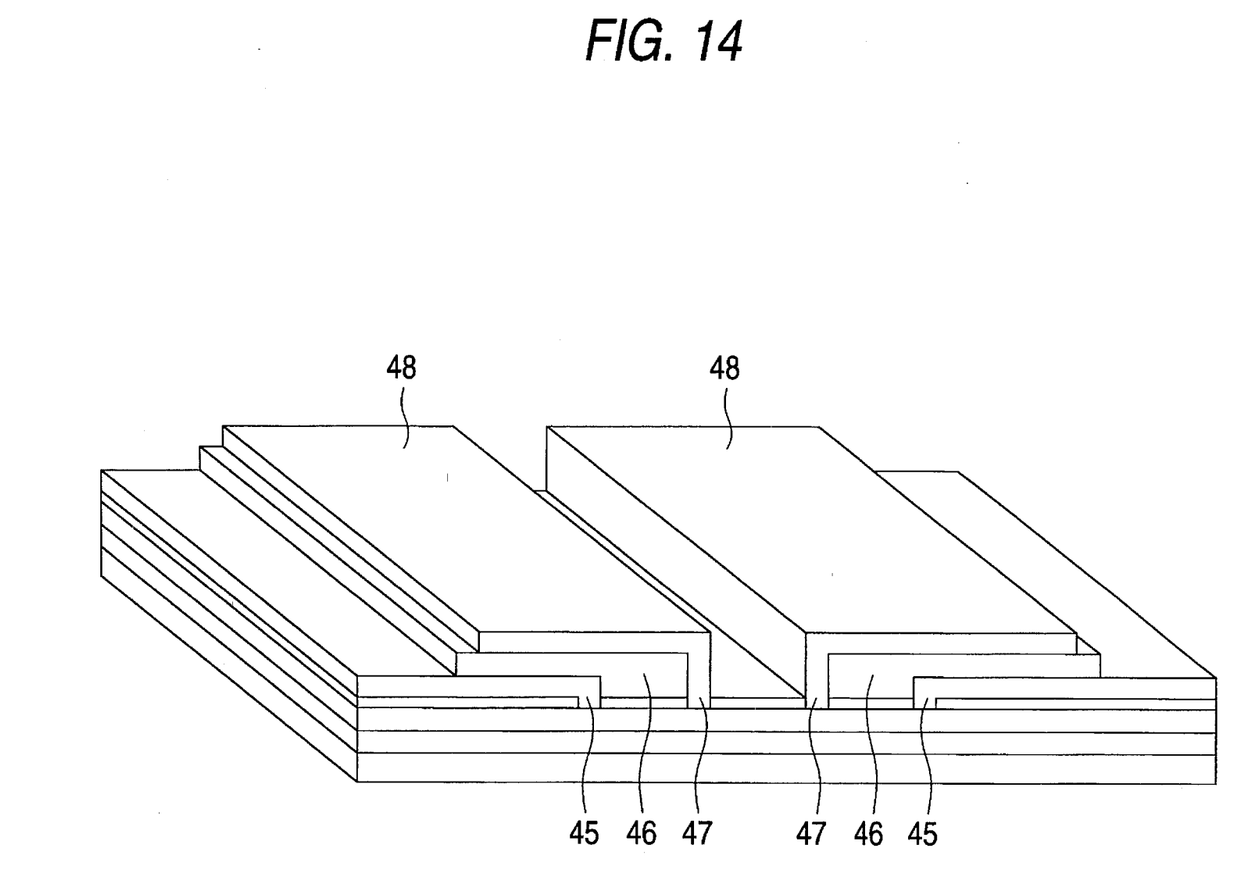
FIG. 14 is an explanatory diagram for showing the wire connecting structure of the stripe electrode and the bonding pad of the conventional multi-beam semiconductor laser element by way of the multi-layer wiring.

As the means for solving such a latter problem that the area for forming the bonding pad could not be maintained, there are proposed the structures (refer to Japanese Laid-open Pat. Application No. 2-39583 and No. 2-237186), and the multi-layer wiring structure. That is, as shown in FIG. 13, the bonding pad 41 is provided apart from the stripe electrode 42, and the bonding pad 41 is connected with the stripe electrode 42 by way of the drawing wiring line 43 on the surface emitting type semiconductor laser element in the first-mentioned structure as described in these Japanese Laid-open Pat. Applications. In the latter multi-layer wiring structure, as illustrated in FIG. 14, the insulating film 46 made of $S_iO_2$ and the like is formed on the stripe electrode 45, and then the bonding pad 48 of the stripe electrode 47 is fabricated on this insulating film 46.

However, since the drawing wiring line 43 intersects the upper portion of the active region 44 extending on the outer stripe in the structure shown in FIG. 13, the depletion region is varied, which is formed in the active region 44 in response to the voltage applied to this drawing wiring line 43, is varied. Accordingly, the profile of current injected into the active layer is changed, so that there is the inconvenience that the optical output power is varied. Also, the structure indicated in FIG. 14 has not only such a drawback that the manufacturing process becomes complex and also the number of processing stage is considerably increased, but also, problem that since the insulating film such as $S_tO_2$ is laminated on $G_aA_s$ whose thermal expansion coefficient is different from that of this insulating film, stress is applied to the semiconductor laser element longitudinal structure containing $G_aA_s$ while the electrode is thermally processed, thereby including an occurrence of transition or dislocation, resulting in damage of the resultant device.

On the other hand, as the method for manufacturing the reflecting surface of the external inclined reflecting mirror, there are proposed: the method for manufacturing the 45-degree reflecting surface with employment of the wet etching (refer to "Continuous Oscillation of BTRS type GaAlAs Semiconductor Laser having Cavity Edge Surface by Chemical Etching in Room, Temperature" by Shibuya et al., Electronic Communication Institute Technical Research Report ED84-95, 1984, pages 75 to 81); and the masstransport method with combination of the wet etching and the annealing (refer to "Surface-emitting GaInAsP/InP Laser with Low Threshold Current and High Efficiency" by Z. L. Lian et al., Applied Physics Letter, Vol. 46, No. 2, 1985, page 115).

The former method for manufacturing the 45-degree reflecting surface with employment of the wet etching owns such a restriction that the stripe extending direction of the surface emitting type semiconductor laser element is limited only to the direction of <0 1 1>, because the 45-degree reflecting surface is fabricated by utilizing that the etched angle of AlGaAs owns the surface azimuth depending characteristic. When the reflecting surface is manufactured by the latter mass transport method, since the laser edge surface positioned opposite to this reflecting surface is cut at the right angle with respect to the plane (100) of the semiconductor substrate, there is a restriction such that the stripe extending direction of the surface emitting type semiconductor laser element is directed only to the direction of <0 1 1>.

Due to the above-described reasons, the above-explained methods described in the publications have such a problem that the surface emitting type semiconductor laser element cannot be freely arranged on the semiconductor substrate.

SUMMARY OF THE INVENTION

Therefore, an object of the present invention is to provide a semiconductor laser array with a very small electric/thermal crosstalk among the respective laser elements by employing a process capable of easily expanding a freedom degree at which a semiconductor laser element having a horizontal-direction cavity and an external inclined reflecting mirror is arranged on a semiconductor substrate, and by making only an interval between the external inclined reflecting mirrors are positioned narrow, e.g., several tens of micrometers while the distance between the stripes of the adjoining semiconductor laser elements is widened.

That is, the present invention is such a semiconductor laser array in which a semiconductor laser element having a horizontal-direction cavity, and plural outer inclined reflecting mirrors capable of reflecting laser light projected from the semiconductor laser element along a specific direction are integrated on a semiconductor substrate in a monolithic form, characterized in that: said outer inclined reflecting mirrors are positioned adjacent to each other, and also are arranged in such a manner that a distance between the adjoining horizontal-direction cavities becomes longer at portions of the cavities remote from said outer inclined reflecting mirrors.

Such an arrangement may constitute a means for solving the above-described crosstalk problems, in which at least one set of the extending directions of the adjoining cavities is not direction a single, but also even when the laser light projecting ports are located close to each other, the cavities are not positioned close to each other. To freely arrange the above-described horizontal-direction cavity and outer inclined reflecting mirror within a semiconductor substrate surface, the semiconductor laser array is manufactured by employing a combination between the dry etching technique capable of etching along the free direction and the annealing technique to induce the mass transport within the semiconductor substrate.

According to the present invention, the cavity, the outer inclined reflecting mirrors, and the etching edge surface can be formed at arbitrary positions within the semiconductor substrate plane irrelevant to the plane azimuth. As a result, even in the semiconductor laser element whose beam intervals are narrow, i.e., ten and several micrometers, only when the outer inclined reflecting mirrors are merely located close to each other, such an arrangement can be achieved that the distance between the adjoining cavities extending from the mirrors is sufficiently long. In other words, the cavities can be arranged in the a radial orientation. As a consequence, it is possible to realize a multi-beam semiconductor laser element without any crosstalk, independently drivable. Also, this radial cavity arrangement may be maintained even at a place where the electrode bonding pad is directly attached to the stripe electrode on the semiconductor substrate.

DETAILED DESCRIPTION OF THE PREFERRED EMBODIMENTS

The present invention will now be described in detailed with reference to various embodiments and comparison examples.
(First Embodiment)

Figure 1:
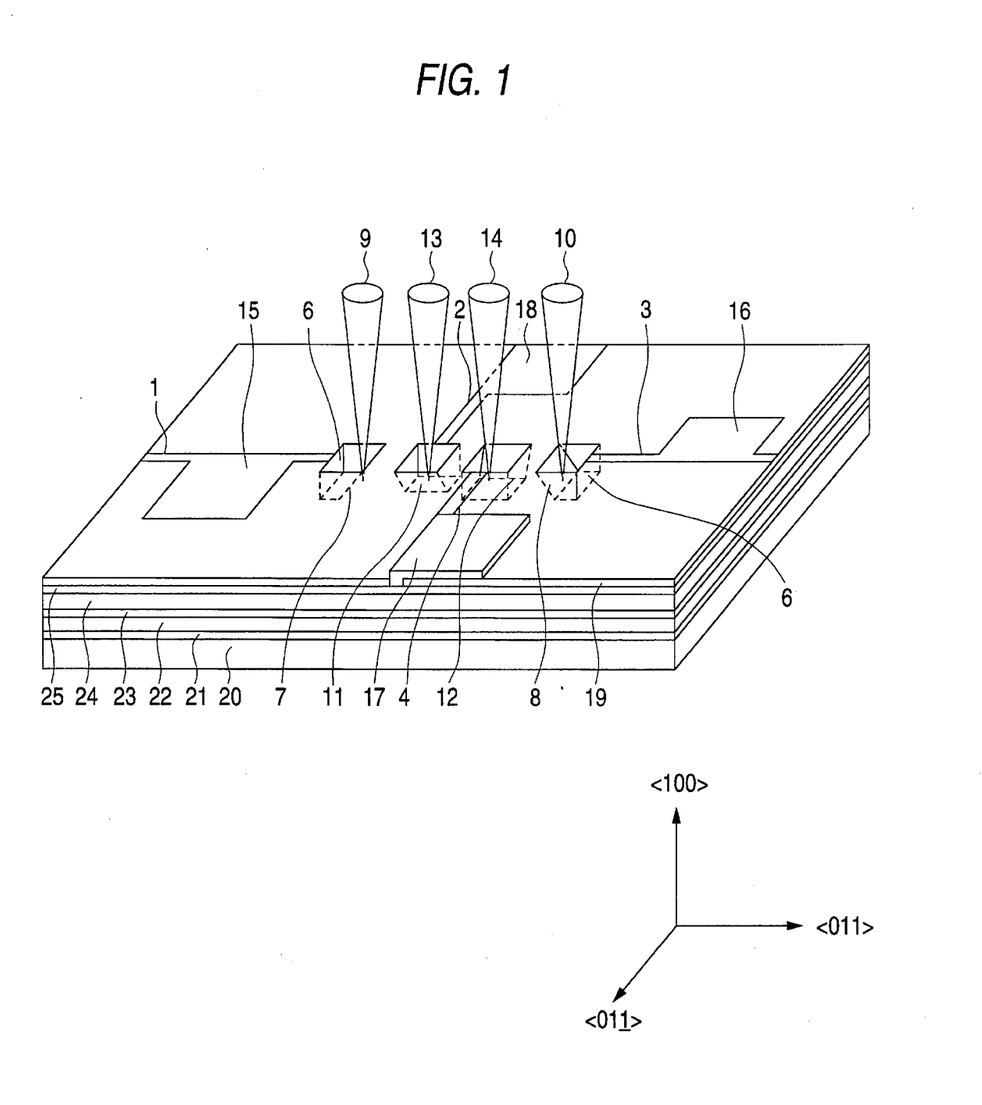
FIG. 1 schematically shows a perspective view of a surface emitting type 4-beam semiconductor laser element corresponding to the semiconductor laser array of the present invention.

FIG. 1 is a perspective view for showing a surface emitting type 4-beam semiconductor laser element, according to the present invention, in which both of a horizontal-direction cavity and an outer inclined reflecting mirror are integrated on a semiconductor substrate in a monolithic form. It should be noted that the following descriptions are made of mainly the structure of the external inclined reflecting mirror portion.

The semiconductor laser element is so arranged that a buffer layer 21, a cladding layer 22, an active layer 23, another cladding layer 24, a contact layer 25, and an insulating layer 19 are successively laminated on a substrate 20; stripe electrodes 1, 2, 3, 4 are formed on the contact layer 25; and bonding pads 15, 16, 17, 18 electrically connected to the stripe electrodes 1, 2, 3, 4 are fabricated on the insulating layer 19.

Two pairs of stripe electrodes 1 and 3 along the direction <0 1 1> of the substrate 20 are arranged on the same shaft, and edge surfaces 5 and 6 are formed at the opposing edge portion of the two pairs of stripe electrodes by way of the dry etching technique such as the reactive ion etching. Laser beams projected from these edge surfaces 5 and 6 are reflected by an outer inclined reflecting mirror 8 partially having such a plane that each of directions <$\sqrt{2}$1 1> is the normal and also another outer inclined reflecting mirror 7 partially having such a plane that each of directions < $\sqrt{2}$–1–1> is the normal, along a direction opposite to that of the semiconductor substrate as well as perpendicular to the semiconductor substrate, and then are outputted as laser beams 9 and 10. Furthermore, another outer inclined reflecting mirror 12 partially having such a plane that the direction <$\sqrt{2}$1–1> is the normal, and a further outer inclined reflecting mirror 11 partially having such a plane that the direction <$\sqrt{2}$–1 1> is the normal are manufactured between the above-mentioned two pairs of outer inclined reflecting mirrors 7 and 8, and also on the same axis as the direction <0 1 1> where these two pairs of outer inclined reflecting mirrors 7 and 8. Laser beams projected from the two stripe electrodes 2 and 4 along the direction <0 1 1> are reflected by the outer inclined reflecting mirrors 12 partially having such a plane that the direction <$\sqrt{2}$1–1> and the outer inclined reflecting mirrors 11 partially having such a plane that the direction <$\sqrt{2}$–1 1> is the normal along a direction opposite to that of the semiconductor substrate and perpendicular to the semiconductor substrate, and then are outputted as laser beams 13 and 14.

As a consequence, the four laser beams 9, 10, 13 and 14 reflected along the above-described directions constitute such a four-multi-beam semiconductor laser element that four light projecting ports are provided on the same axis as the two pairs of stripe electrodes along the direction <0 1 1>.

Figure 2:
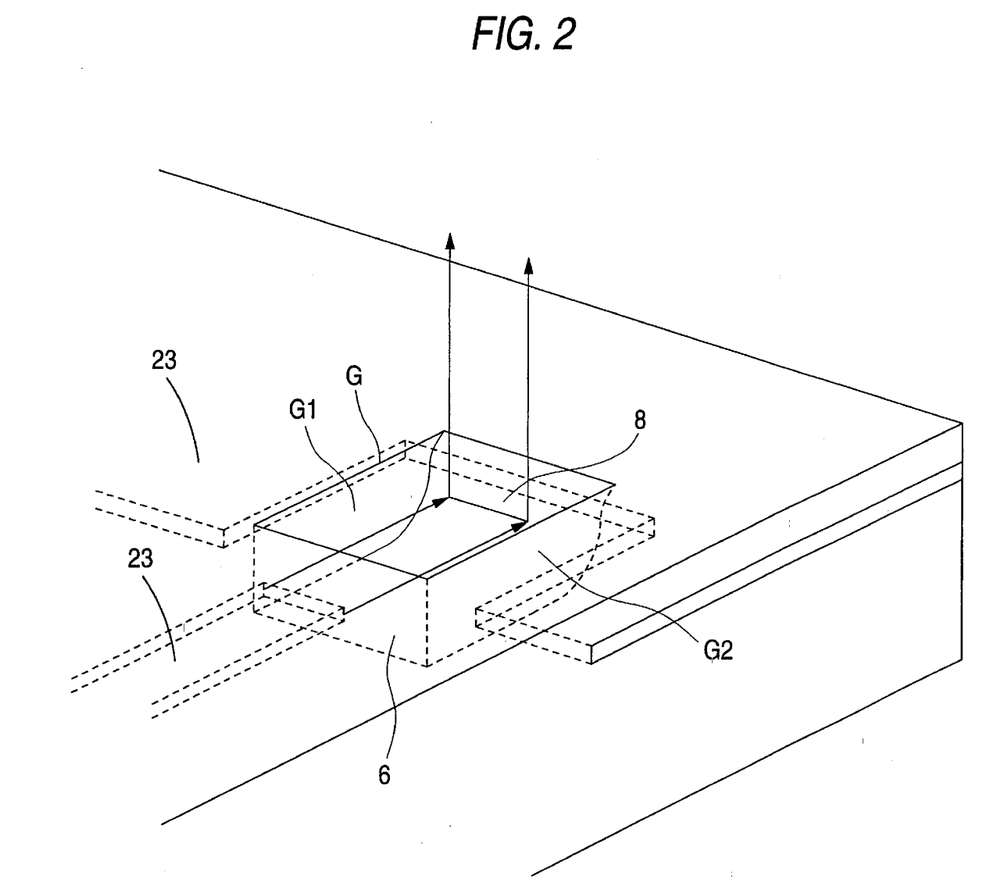
FIG. 2 is an enlarged perspective view for showing an outer inclined reflecting mirror 8 of the surface emitting type 4-beam semiconductor laser element shown in FIG. 1.

FIG. 2 is an enlarged perspective view for showing a portion of the outer inclined reflecting mirror 8 of the surface emitting type 4-beam semiconductor laser element indicated in FIG. 1. The outer inclined reflecting mirror 8 is formed in a hole portion G having a rectangular shape. Both of the outer inclined reflecting mirror 8 and the laser light projecting edge surface 6 constitute an inner wall, both sides of which are surrounded by side walls G1 and G2.

In the 4-beam multi-beam semiconductor laser element having the above-described structure, the outer inclined reflecting mirrors 7, 8, 11, 12 are merely positioned close to each other without locating the stripe electrodes 1, 2, 3, 4 close to each other in order to narrow the beam interval. Furthermore, as illustrated in FIG. 1, the stripe electrodes of the semiconductor laser element positioned adjacent to one semiconductor laser element are not located parallel to each other, but also are not located close to each other, so that the electric crosstalk and the thermal crosstalk are negligibly low.

It should be noted that the above-described stripe electrodes of the directions of <0 1 1> and <0 1 1> may be reversed to each other. Since the bonding pads 15, 16, 17, 18 having the dimensions of 100×100 micrometers are directly formed via an insulating film 19 such as $S_iO_2$ on the stripe electrodes 1, 2, 3, 4, no drawing wiring line is required.

Subsequently, a description will be made of a method for manufacturing the outer inclined reflecting mirror of the above-explained semiconductor laser element. In FIG. 2, there is simply shown a manufacturing process of the surface emitting type semiconductor laser element according to the present invention. The longitudinal structure of the laser element is manufactured by successively laminating an n-InP buffer layer 21, an n-InP cladding layer 22, a GaInAsP activated layer 23, a p-InP cladding layer 24, and a p+-InP contact layer 25 on an n-InP substrate 20 by way of the chemical beam vapor deposition method (CBE), the organic metal vapor phase epitaxy method (MOCVD), and the liquid phase epitaxy method (LPE).

It should be understood that the structure of the respective semiconductor laser elements along the lateral direction may be realized by the embedded structure with employment of the Si impurity diffusion as described in Japanese Laid-open Patent Application No. 2-237186, the embedded narrow stripe structure by properly utilizing regrowth (see FIG. 1 of Journal of Applied Physics Vol. 51, No. 8, 1980, page 4539), or the ridge stripe embedded structure for the red GaAlInP semiconductor laser element (as described in ELECTRONICS LETTERS, Vol.28, No.14, 1992, page 1329). In this case, the etching process of the ridge stripe is performed by the dry-etching with no surface azimuth depending characteristic as to the etching shape. Next, as shown in FIG. 3(a) and FIG. 4(a), an etching mask 26 is formed by way of the normal photolithography, and then is etched away, as represented in FIG. 3(b) and FIG. 4(b), by employing reactive ion etching with etching gas of $Cl_2:O_2$, or $CH_4/H_2/Ar$.

Figure 3:
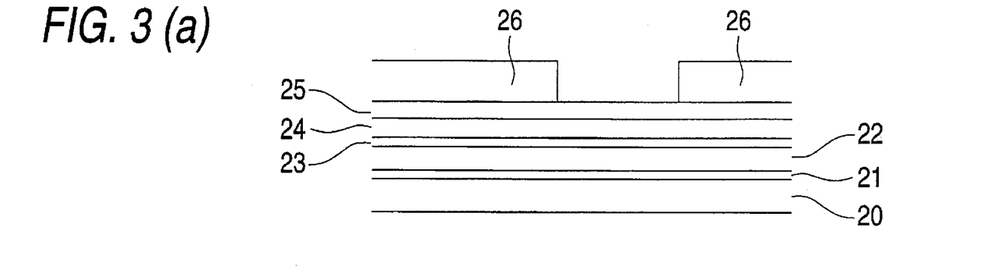
FIGS. 3(a) to 3(e) are sectional views for indicating a front half portion of a manufacturing process for a 45-degree outer inclined reflecting mirror.
Figure 4:
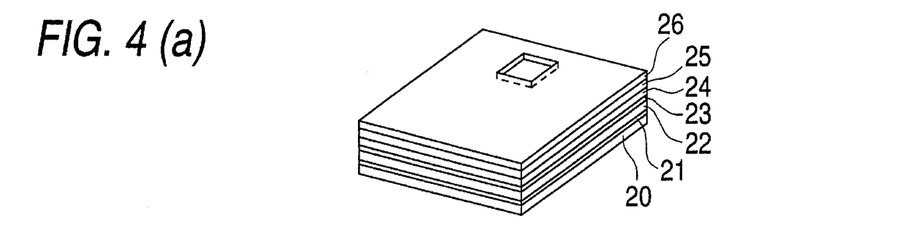
FIGS. 4(a) to 4(e) are perspective views for denoting the front half portion of the manufacturing process for the 45-degree outer inclined reflecting mirror.

Thereafter, once the etching mask 26 is removed, and such an etching mask 27 as SiNx adheres thereto by way of the photolithography as shown in FIG. 3(c) and FIG. 4(c), and then a mesh point portion 28 of FIG. 3(c) is etched away by using $Cl_2:O_2$ as the etching gas by way of the reactive ion etching. Next, when the etching mask 27 is removed, both a two-stage step 29 and a laser edge surface 30 are formed as illustrated in FIG. 3(d) and FIG. 4(d). Then, the entire structure having the two-stage step 29 and the laser edge surface 30, as illustrated in FIG. 3(d) and FIG. 4(d), is filled into a quartz tube together with phosphor, otherwise inserted into the reactive tube of the MOCVD method so as to be heated at the temperature higher than, or equal to 670° C. for approximately 30 minutes in $pH_3$ (phosphine) atmosphere. Thus, the two-stage step 29 as shown in FIG. 3(d) and FIG. 4(d) is embedded by InP which has been mass-transported from the n-InP cladding layer 22, the p-InP cladding layer 24, and the P+-InP contact layer 25, so that this two-stage step 29 becomes another inclined reflecting mirror 31 as illustrated in FIG. 3(e) and FIG. 4(e).

The reason why the dry etching such as the reactive ion etching is employed in the above-described manufacturing process of the outer inclined reflecting mirror is to continuously manufacture the step having the same shapes irrelevant to the azimuth of the stripe. Since the dry etching does not depend upon also the plane azimuth of the substrate under use, this dry etching technique may be applied to not such a substrate with the orientation of just <1 0 0>, but to an off substrate. To the contrary, since the etched shape by the wet etching technique depended on the azimuth, the shape of the reflecting surface of the outer inclined reflecting mirror 31 differs, depending on the azimuth. Thus, it is impossible that a plurality of laser beams can be projected in high precision along an upper direction perpendicular to the semiconductor substrate. Although the etching process is carried out in the two-stage step form in this embodiment, the number of the step is not limited to two stages so as to obtain the reflecting mirror having a desired reflecting surface.

Figure 5:
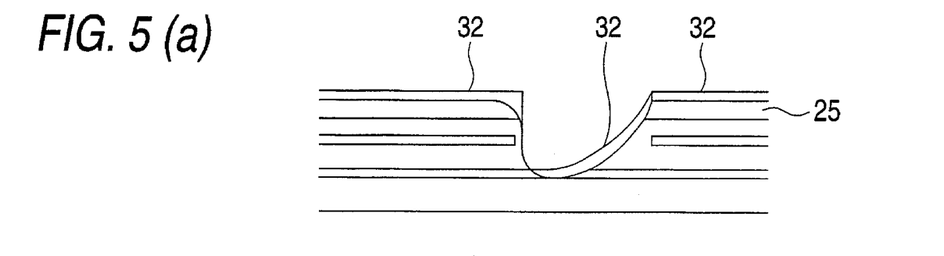
FIGS. 5(a) to 5(d) are sectional views for representing a rear half portion of the manufacturing process for the 45-degree outer inclined reflecting mirror.

Then, an insulating film 32 such as $S_iO_2$ and $S_iN_x$ is deposited over an entire surface of the contact layer 25 of the semiconductor laser element, and also the surface of the outer inclined reflecting mirror 8, as shown in FIG. 5(a), by using a sputtering apparatus. The reason why the sputtering process with strong directivity is employed is such that the insulating film such as $S_iO_2$ and $S_iN_x$ is not entered into the edge surface of the laser element. As indicated in FIG. 5(b), an electrode pattern is fabricated, as shown in FIG. 5(b), in such a manner that a photoresist 33 is coated by way of the normal photolithography, and then the insulating film 32 such as $S_iO_2$ of the region without the photoresist is etched away by buffering hydrogen fluoride (BHF) to be removed. A hole for making a contact is formed in the above-described etched place. Thus, as shown in FIG. 5(c), a p-side electrode material 34 mainly containing Au (gold) such as AuZn/Au, Cr/Au, or Ti/Pt/Au is successively vapor-deposited over the entire surface along the upper surface direction of the semiconductor laser element by the resistance heating vapor depositing device. Finally, the photoresist 33 is removed to lift off the unnecessary electrode material, so that a p-side electrode 34 is fabricated as shown in FIG. 5(d). Furthermore, to increase reflectivity of the inclined reflecting mirror 8, such a metal as Au having high reflectivity may be attached to the surface of the inclined reflecting mirror. The method for forming an n-side electrode is performed in accordance with the conventional forming method. That is, after the n-InP substrate has been polished, an n-side electrode mainly containing Au such as Sn/Au is vapor-deposited on the polished surface of the n-InP substrate. The semiconductor laser element to which the electrode has been attached is inserted into a hot wall type annealing furnace, and the electrode metal is made as sn alloy at the temperature of 400° C. to obtain an ohmic electrode.

(Second Embodiment)

Figure 6:
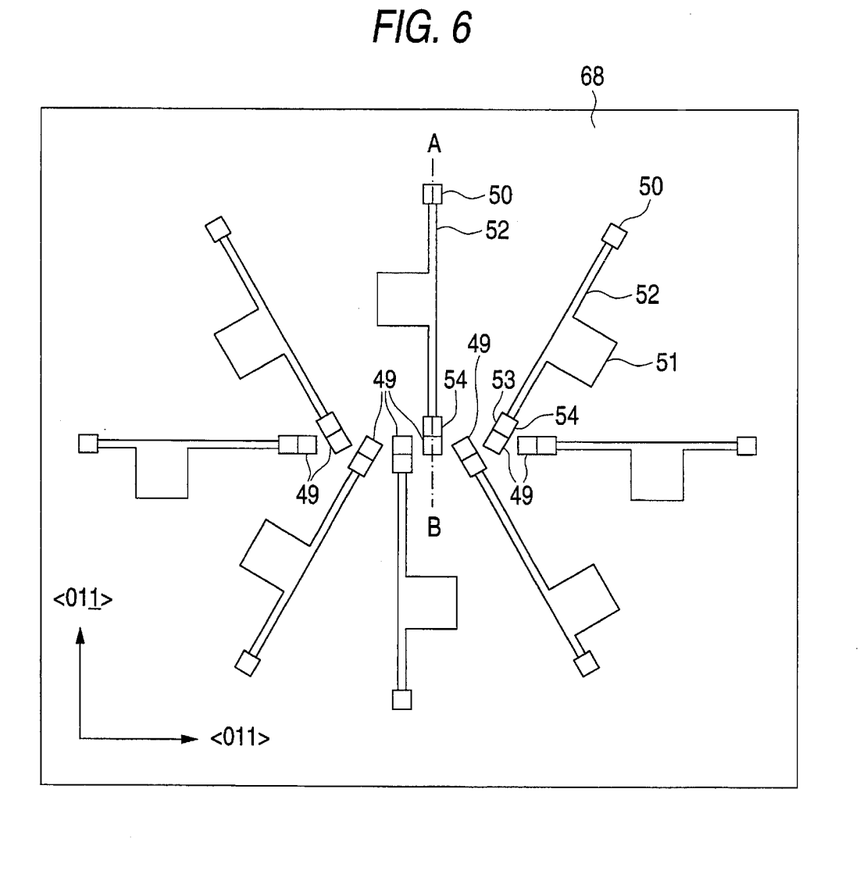
FIG. 6 is a plan view of a surface emitting type 8-beam semiconductor laser element.
Figure 7:
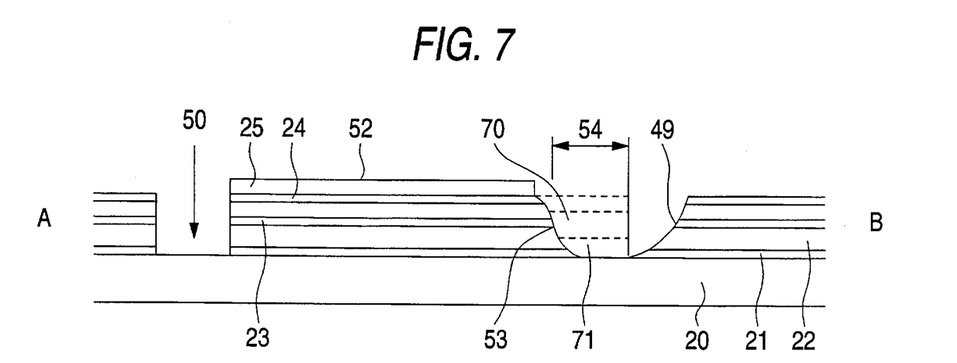
FIG. 7 is a sectional view of the surface emitting type 8-beam semiconductor laser element.

FIG. 6 is such a view that a surface emitting type 8-beam semiconductor laser element is observed from an upper direction. FIG. 7 is a cutting plane of the surface emitting type 8-beam semiconductor laser element shown in FIG. 6, taken along a line A–B.

Reference numeral 68 indicates the surface emitting type 8-beam semiconductor laser element by sequentially laminating an n-InP buffer layer, an n-InP cladding layer, a GaInAsP activated layer, a p-InP cladding layer, and a p+-InP contact layer on a semiconductor substrate, and then by cutting away the resultant substrate in a rectangular shape. In the four-beam surface emitting type semiconductor laser element shown in FIG. 1, the extending direction of the cavity is only <0 1 1> and <0 1 $\underline{1}$>, and the extending directions of the cavity are perpendicular to each other, or parallel to each other. In the 8-beam surface emitting type semiconductor laser element indicated in FIG. 6, the extending direction of the cavity is expanded along the direction which may be expressed by adding/subtracting two vectors <0 1 1> and <0 1 $\underline{1}$>, and thus the number of laser beams is increased. In this case, such a laser element having the cavity extending directions other than <0 1 1> and <0 1 $\underline{1}$> cannot be formed by cleaving another edge surface, not the projection edge surface. As a consequence, an edge surface 50 is manufactured by utilizing the dry etching in the same manner as the method for manufacturing the projection edge surface 53. An inclined reflecting mirror 49 is present at each tip portion of the stripe electrodes 52. These eight inclined reflecting mirrors 49 are integrated at a central portion of the device in an interval of ten and several microns. Furthermore, a bonding pad 51 is provided on each of the stripe electrodes.

It should be noted that an etching groove 54 provided between the edge surface 52 and the inclined reflecting mirror 49, as shown in FIG. 7, is defined by shortening a distance between the edge surface 53 and the inclined reflecting mirror 49 in such a manner that the laser light passing through this groove is not expanded. Alternatively, either a dielectric optical waveguide layer, or a semiconductor optical waveguide layer 71, which owns a portion having high refractive index (namely, core 70 indicated by a broken line) may be provided at a position corresponding to the etching groove 54 in order not to expand the laser light. In this case, the edge surface 53 of the cavity along the horizontal direction may be freely separated from the inclined reflecting mirror 49. The more remote the cavity is in the horizontal direction from the inclined reflecting mirror, the longer the distance between the adjoining cavities in the horizontal direction can be made. As a consequence, a total number of cavities in the horizontal direction may be further increased, and also the number of inclined reflecting mirrors 49 corresponding to the laser projection ports may be greatly increased.

(Third Embodiment)

Figure 8:
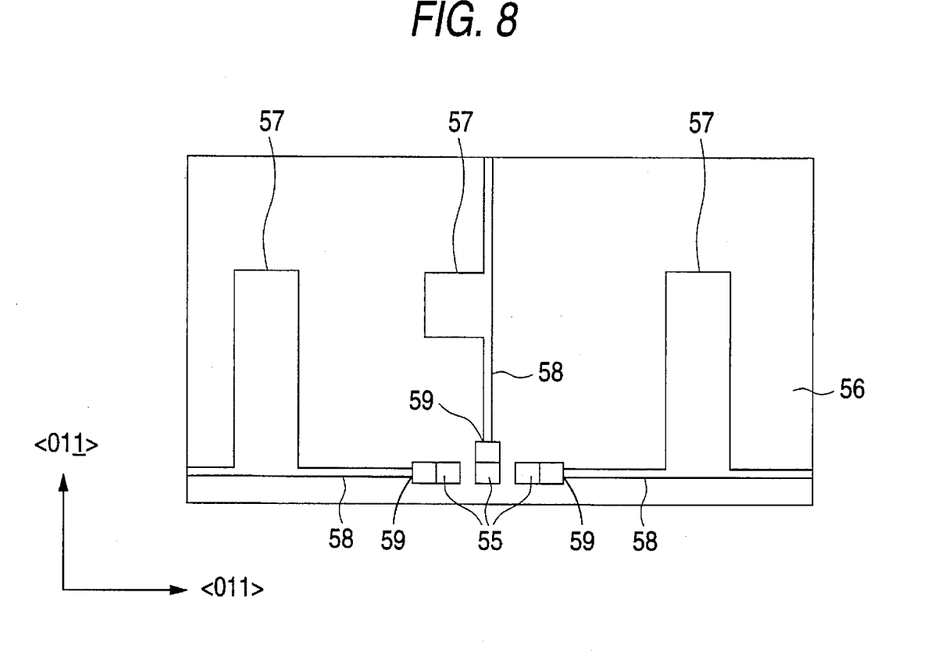
FIG. 8 is a plan view of a surface emitting type 3-beam semiconductor laser array in which the respective outer inclined reflecting mirrors are formed near a side edge of a semiconductor substrate.

Although the outer inclined reflecting mirror 55 is provided at the center portion of the semiconductor substrate 56 in the above-described embodiment, this outer inclined reflecting mirror is not always present at the center portion of the semiconductor substrate. For instance, as shown in FIG. 8, each of these outer inclined reflecting mirrors 55 may be formed near the side edge of the semiconductor substrate 56. It should be noted that in this drawing, reference numeral 57 is a bonding pad, reference numeral 58 indicates a stripe electrode, and reference numeral 59 denotes an edge surface formed by the etching process. The horizontal-direction cavity is provided at the under layer of the respective stripe electrodes 58, and the extending direction of this stripe electrode 58 is <0 1 1> and <0 1 1̄>. Otherwise, this extending direction may be realized by any directions expressed by summing both of these vectors <0 1 1> and <0 1 1̄>. It should be understood that the direction of the beam reflected from the outer reflecting mirror is a front direction perpendicular to the paper plane of FIG. 8.

(Fourth Embodiment)

Figure 9:
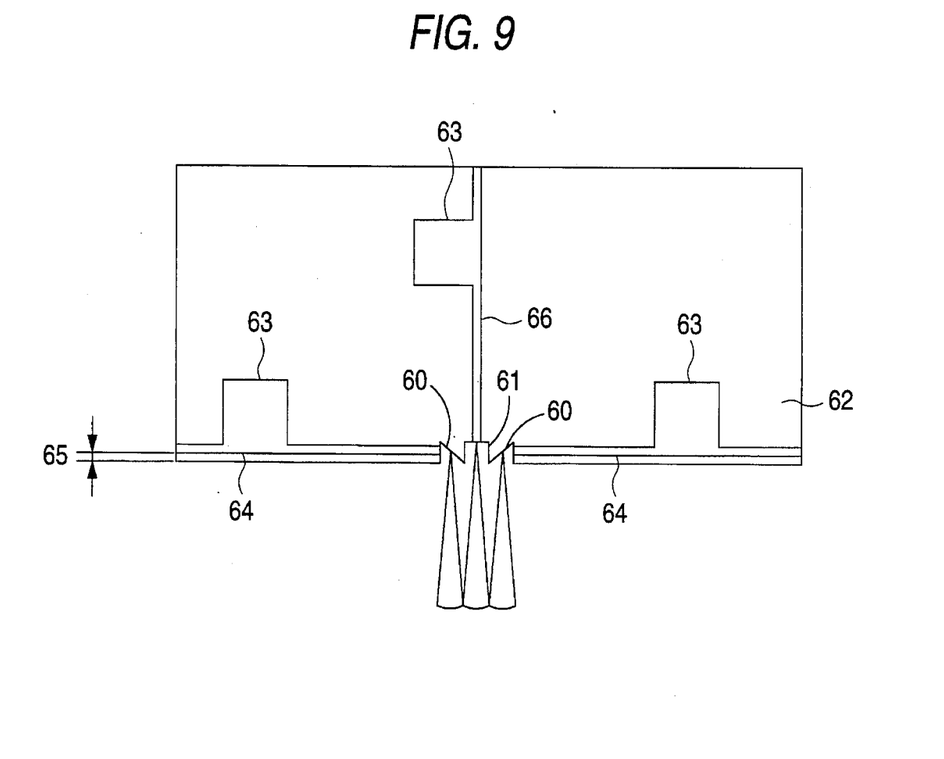
FIG. 9 is a plan view of the surface emitting type 3-beam semiconductor laser array.

FIG. 9 schematically shows an edge emitting type multi-beam semiconductor laser element such that a projection direction of laser light reflected from an outer inclined reflecting mirror corresponds to a horizontal direction with respect to a surface of a semiconductor substrate. A feature of this laser element is achieved that the normal of a reflecting plane 60 of the outer inclined reflecting mirror is such directions of <0 1 1> and <0 1 0>, and the laser light reflected from this reflecting plane 60 is projected along the same direction of <0 1 1>. In combination with laser light projected from an edge surface 61 of the horizontal-direction cavity located at an under layer of a stripe electrode 66, these laser light beams constitute a 3-beam edge surface emitting type semiconductor laser element. The method for manufacturing the edge surface containing the reflecting plane 60 of the outer inclined reflecting mirror for this laser element and the edge surface 61 thereof by way of the etching process, may be realized by employing the photolithography and the dry etching process for the thin-film laminated layer structure manufactured by successively laminating the n-InP cladding layer, the InGaAsP activated layer, the p-InP cladding layer, and the p+-InP contact layer on the semiconductor substrate. In this case, it is not necessary to especially perform the mass transport by the annealing process. Reference numeral 62 shows a semiconductor substrate, reference numeral 63 indicates a bonding pad, and reference numerals 64 and 66 denote stripe electrodes. It should also be noted that an interval indicated by reference numeral 65 in FIG. 8 is made wider as possible, and may be selected to be such a distance that the respective laser element characteristics of the three semiconductor laser elements do not greatly differ from each other.

Although the semiconductor laser element having the GaInAsP active layer has been employed in this embodiment, the present invention may be applied to other semiconductor laser elements with the materials having other oscillating wavelengths, e.g., AlGaAs, AlGaInP, AnCdSSe, and ZnMgSSe when the etching condition and the annealing temperature are varied.

According to the present invention, it is possible to provide a multi-beam semiconductor laser element without any crosstalk, capable of being separately driven, in which a beam projecting interval is made narrow. This multi-beam semiconductor laser element may contribute to increase the printing speed of the laser printer, to shorten the data writing time of the optical disk, and to realize other highspeed optical communications, as well as highspeed light transmission among neuroelements. Also, according to the present invention, no care should be taken to assure the place where the bonding pad is provided, the drawing wiring line, and the multi-layer wiring line, so that the semiconductor substrate can be effectively utilized, and the manufacturing process can be simplified.

What is claimed is:

1. A semiconductor laser array, comprising:

a semiconductor substrate, a plurality of semiconductor laser elements each having an elongated horizontal-direction cavity provided on said semiconductor substrate, and a plurality of inclined outer reflecting mirrors, one near one end of each of the cavities, capable of reflecting laser light projected from said semiconductor laser elements along a specific direction, and integrated on said semiconductor substrate in a monolithic form, said inclined outer reflecting mirrors being positioned adjacent to each other, and arranged in such a manner that space between the adjoining horizontal-direction cavities is increased with increased distance along the length of the horizontal-direction cavities from said inclined outer reflecting mirrors.

2. A semiconductor laser array of claim 1, wherein said semiconductor laser elements are arranged in a radial orientation.

3. A semiconductor laser array of claim 1, wherein said outer inclined reflecting mirrors are arranged in a line.

4. A semiconductor laser array of claim 1, wherein said semiconductor laser elements are arranged in a radial orientation, and said outer inclined reflecting mirrors are arranged in a line.

5. A semiconductor laser array of claim 1, wherein said specific direction along which the laser light is reflected corresponds to a vertical direction with respect to a surface of said semiconductor substrate.

6. A semiconductor laser array of claim 1, wherein said specific direction along which the laser light is reflected corresponds to a horizontal direction with respect to a surface of said semiconductor substrate.

7. A semiconductor laser array of claim 1, wherein said semiconductor laser element having said horizontal-direction cavity is manufactured on a plane (1 0 0) of said semiconductor substrate.

8. A semiconductor laser array of claim 6, wherein said horizontal-direction cavity is arranged at a position where a cavity is extended along a direction <0 1 1> and at a position where a cavity is extended along a direction <0 1 1̄> within a surface of said semiconductor substrate.

9. A semiconductor laser array of claim 1, wherein a surface of said outer inclined reflecting mirror is covered with an insulating film.

10. A semiconductor laser array of claim 9, wherein said insulating film is selected from a group of $S_iO_2$ and $S_iN_x$.

11. A semiconductor laser array of claim 1, wherein a surface of said outer inclined reflecting mirror is covered with metal having high reflectivity.

12. A semiconductor laser array of claim 11, wherein said metal is selected from a group of Au and an alloy mainly containing Au.

13. A semiconductor laser array of claim 1, wherein a bonding pad is not connected to a stripe electrode by way of a drawing wiring line, but said semiconductor laser array owns a stripe electrode manufactured with said bonding pad via an insulating film in an integral form.

14. A semiconductor laser array of claim 1, wherein an optical wave guide is interposed between said outer inclined reflecting mirror and an edge surface formed by an etching process.

\* \* \* \* \*